(12) United States Patent
Scheiper et al.

(10) Patent No.: US 8,404,550 B2
(45) Date of Patent: Mar. 26, 2013

(54) PERFORMANCE ENHANCEMENT IN PFET TRANSISTORS COMPRISING HIGH-K METAL GATE STACK BY INCREASING DOPANT CONFINEMENT

(75) Inventors: Thilo Scheiper, Dresden (DE); Sven Beyer, Dresden (DE); Andy Wei, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 106 days.

(21) Appl. No.: 12/905,383

(22) Filed: Oct. 15, 2010

(65) Prior Publication Data

US 2011/0127618 A1 Jun. 2, 2011

(30) Foreign Application Priority Data

Nov. 30, 2009 (DE) .......................... 10 2009 047 304

(51) Int. Cl.
*H01L 21/336* (2006.01)
(52) U.S. Cl. ................................. 438/289; 257/E21.618
(58) Field of Classification Search .................. 257/213, 257/288, 402, 403, 404, 408, 409, 410, 613, 257/616; 438/142, 197, 289, 290, 291
See application file for complete search history.

(56) References Cited

U.S. PATENT DOCUMENTS

| | | | |
|---|---|---|---|
| 6,225,151 B1 * | 5/2001 | Gardner et al. | 438/162 |
| 6,544,854 B1 * | 4/2003 | Puchner et al. | 438/308 |
| 7,612,421 B2 | 11/2009 | Enicks | 257/407 |
| 2003/0080361 A1 * | 5/2003 | Murthy et al. | 257/288 |
| 2005/0108892 A1 * | 5/2005 | Wu et al. | 34/444 |
| 2006/0281254 A1 * | 12/2006 | Lee et al. | 438/257 |
| 2009/0206445 A1 * | 8/2009 | Fujimoto et al. | 257/506 |

OTHER PUBLICATIONS

Translation of Official Communication from German Patent Office for German Patent Application No. 10 2009 047 304.1 dated Feb. 8, 2011.

* cited by examiner

*Primary Examiner* — Ha Tran T Nguyen
*Assistant Examiner* — Kevin Quinto
(74) *Attorney, Agent, or Firm* — Williams, Morgan & Amerson, P.C.

(57) ABSTRACT

In a P-channel transistor comprising a high-k metal gate electrode structure, a superior dopant profile may be obtained, at least in the threshold adjusting semiconductor material, such as a silicon/germanium material, by incorporating a diffusion blocking species, such as fluorine, prior to forming the threshold adjusting semiconductor material. Consequently, the drain and source extension regions may be provided with a high dopant concentration as required for obtaining the target Miller capacitance without inducing undue dopant diffusion below the threshold adjusting semiconductor material, which may otherwise result in increased leakage currents and increased risk of punch through events.

16 Claims, 7 Drawing Sheets

PERFORMANCE ENHANCEMENT IN PFET TRANSISTORS COMPRISING HIGH-K METAL GATE STACK BY INCREASING DOPANT CONFINEMENT

BACKGROUND OF THE INVENTION

1. Field of the Invention

Generally, the present disclosure relates to the fabrication of integrated circuits, and, more particularly, to P-channel transistors comprising a high-k metal gate electrode formed in an early manufacturing stage.

2. Description of the Related Art

The fabrication of complex integrated circuits requires the provision of a large number of transistor elements, which represent the dominant circuit element in complex integrated circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability.

With a reduced channel length, generally, a shallow dopant profile may be required in the drain and source regions, while nevertheless a moderately high dopant concentration is required in view of providing the low series resistance, which in turn results in a desired drive current in combination with a reduced channel resistance. A shallow dopant profile in combination with a low overall drain and source resistance is typically realized by forming so-called drain and source extension regions, which may represent extremely shallow doped areas extending below the gate electrode structure so as to appropriately connect to the channel region. On the other hand, an increased lateral offset with respect to the channel region is adjusted on the basis of appropriately dimensioned sidewall spacers, which are used as implantation masks for forming the actual drain and source regions with a desired high dopant concentration and with an increased depth compared to the drain and source extension regions. By appropriately selecting the size of the drain and source extension regions, channel controllability may be maintained for very short channel transistors while also providing a desired low overall series resistance in connecting the drain and source regions to the channel region. Consequently, for a desired performance of sophisticated transistor elements, a certain degree of overlap of the drain and source extension regions with the gate electrode is desirable in order to obtain a low threshold voltage and a high current drive capability. The overlap of the drain and source extension regions with the gate electrode gives rise to a specific capacitive coupling that is also referred to as Miller capacitance. Typically, a desired Miller capacitance is adjusted on the basis of implantation processes in which the drain and source dopants may be introduced in order to form the basic configuration of the drain and source extension regions, wherein the final shape of these regions may then be adjusted on the basis of a sequence of anneal processes in which implantation-induced damage are re-crystallized and also a certain degree of dopant diffusion may occur, thereby finally determining the resulting Miller capacitance.

Upon continuously reducing the channel length of field effect transistors, generally, an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in increasing the charge carrier mobility in the channel region, thereby also enhancing overall performance of field effect transistors. One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors. The desired compressive strain component may be obtained according to well-established approaches by incorporating a strain-inducing semiconductor material, for instance in the form of a silicon/germanium mixture or alloy, in the active region of the P-channel transistor. For example, after forming the gate electrode structure, corresponding cavities may be formed laterally adjacent to the gate electrode structure in the active region and may be refilled with the silicon/germanium alloy which, when grown on the silicon material, may have an internal strained state, which in turn may induce a corresponding compressive strain component in the adjacent channel region. Consequently, a plurality of process strategies have been developed in the past in order to incorporate a highly strained silicon/germanium material in the drain and source areas of P-channel transistors, which may, however, also require corresponding adaptations in view of obtaining a desired lateral and vertical dopant profile for the drain and source regions and the corresponding extension regions as, for instance, boron which is frequently used as a P-type dopant species, may have a significantly different diffusion behavior in a silicon/germanium material compared to a silicon-based material. That is, in a silicon/germanium material having a germanium concentration of approximately 20 atomic percent or higher, the diffusivity of the boron species is significantly less compared to a silicon species, which may have to be taken into consideration when adjusting the overall transistor characteristics. For example, typically, the drain and source extension regions may be formed so as to be located within a silicon material so that the Miller capacitance may be adjusted on the basis of the diffusion characteristics in silicon material so as to obtain the required overlap of the drain and source extension regions with the gate electrode structure without having to take into consideration the reduced diffusivity in a silicon/germanium material.

During the continuous reduction of the critical dimensions of transistors, an appropriate adaptation of the material composition of the gate dielectric material has been proposed such that, for a physically appropriate thickness of a gate dielectric material, i.e., for reducing the gate leakage currents, nevertheless, a desired high capacitive coupling may be achieved. Thus, material systems have been proposed which have a significantly higher dielectric constant compared to the conventionally used silicon dioxide-based materials, silicon oxynitride materials and the like. For example, materials including hafnium, zirconium, aluminum and the like may have a significantly higher dielectric constant and are therefore referred to as high-k dielectric materials, which are to be understood as materials having a dielectric constant of 10.0 or higher when measured in accordance with typical measurement techniques. As is well known, the electronic characteristics of the transistor elements also strongly depend on the work function of the gate electrode material which influences the band structure of the semiconductor material in the channel region separated from the gate electrode material by the gate dielectric material. In well-established polysilicon/silicon dioxide-based gate electrode structures, the corresponding threshold voltage, that is strongly influenced by the gate dielectric material and the adjacent electrode material, is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors. For this reason, corresponding metal-containing conductive materials may be positioned close to the high-k gate dielectric material in order to form an appropriately designed interface that results in the target work function of the gate electrode structure. In many conventional approaches, the work function adjustment may be performed at a very late manufacturing stage, i.e., after any high temperature processes, which may require the replacement of a placeholder material of the gate electrode structures, such as polysilicon, and the incorporation of appropriate work function adjusting species in combination with an electrode metal, such as aluminum and the like. In this case, however, very complex patterning and deposition process sequences may be required on the basis of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the corresponding metal species may be thermally stabilized and encapsulated in order to obtain the desired work function and thus threshold voltage of the transistors without being unduly influenced by the further processing. For this purpose, it turns out that, for P-channel transistors, an appropriate adaptation of the band gap of the channel semiconductor material may be required in order to appropriately set the work function of the P-channel transistors. For this reason, frequently, a so-called threshold adjusting semiconductor material, for instance in the form of a silicon/germanium mixture, may be formed on the active regions of the P-channel transistors prior to forming the gate electrode structures, thereby obtaining the desired offset in the band gap of the channel semiconductor material. Although this concept is a promising approach for forming sophisticated high-k metal gate electrode structures in an early manufacturing stage, the adjustment of the transistor characteristics may be difficult to be achieved on the basis of conventional strategies due to the presence of the channel silicon/germanium material, as will be described in more detail with reference to FIGS. 1a-1d.

FIG. 1a schematically illustrates a cross-sectional view of a semiconductor device 100 comprising a substrate 101 and a silicon-based semiconductor layer 102. The semiconductor layer 102 comprises a plurality of "active" regions, such as a semiconductor region 102A, which is laterally delineated by an isolation structure 102B, for instance provided in the form of a shallow trench isolation. The shallow trench isolation 102B is comprised of any appropriate insulating material, such as silicon dioxide, silicon nitride and the like. It should be appreciated that an active region, such as the semiconductor region 102A, is to be understood as a semiconductor region in and above which one or more transistors are to be formed. For instance, a transistor 150 in an early manufacturing stage represents a P-channel transistor of the device 100, which is to be formed on the basis of the semiconductor region 102A. Consequently, in this manufacturing stage, the transistor 150 comprises a well dopant species (not shown) which imparts a desired basic conductivity type to the semiconductor region 102A, for instance an N-type conductivity. Furthermore, as previously explained, a threshold adjusting semiconductor material 103 in the form of a silicon/germanium alloy, i.e., in the form of a crystalline silicon/germanium mixture, is formed on the semiconductor material 102A and is to be considered as a part of the active region of the transistor 150. The silicon/germanium material 103, which is also referred to as a threshold adjusting semiconductor material, has a specific thickness and material composition, i.e., germanium concentration, in order to obtain a desired band gap offset, as previously discussed. For instance, the material 103 may have a thickness of approximately eight to several tenths of angstrom with a germanium concentration of approximately 20-30 atomic percent. Moreover, the transistor 150 comprises a gate electrode structure 160, which in turn comprises a gate dielectric material, for instance in the form of a first layer 161 and a second layer 162, such as a silicon oxynitride material as the layer 161 in combination with a high-k dielectric material layer such as hafnium oxide, a silicon oxynitride/hafnium mixture and the like. Furthermore, a conductive cap material 164, which typically also comprises a work function adjusting species, such as aluminum, is formed above the gate dielectric material 162, followed by a further electrode material 165, such as amorphous or polycrystalline silicon. It should be appreciated that in particular the cap material 164 including the work function adjusting species may be provided in the form of a material layer stack including several materials, such as titanium nitride, aluminum and the like. In other approaches, the work function metal species may be incorporated in at least one of the dielectric materials 161 and 162, for instance in the material 162, thereby generating charges, such as dipole charges therein. In this case, the cap material may be provided in the form of any desired electrode material. Moreover, the gate electrode structure 160 comprises a spacer structure 166, for instance comprising an oxide liner (not shown) in combination with a silicon nitride spacer element, thereby reliably confining the sidewalls of sensitive materials, such as the layers 161, 162 and 164. Moreover, a dielectric cap material 157, such as a silicon nitride material, is formed on top of the electrode material 165.

The semiconductor device 100 as illustrated in FIG. 1a may be formed on the basis of any appropriate manufacturing techniques. For example, the active region 102A is formed by providing the isolation structure 102B and implanting a desired well dopant species. Thereafter, the threshold adjusting semiconductor material 103 is formed by epitaxial growth techniques, for instance by forming a mask layer, such as a silicon dioxide layer, on active regions which do not require the material 103 and by performing a selective deposition process in which material deposition may be substantially restricted to exposed crystalline silicon areas, such as the semiconductor region 102A. Next, any mask materials may be removed and the complex gate layer stack may be formed by appropriate deposition techniques. Thereafter, a complex lithography and patterning process sequence is applied to form the materials 165, 164, 162 and 161 with the desired gate length, i.e., in FIG. 1a, the horizontal extension of these materials, which may be 50 nm and less in sophisticated semiconductor devices. Furthermore, also the dielectric cap layer 167 may be patterned together with the electrode material 165. Next, cavities 102C are to be formed in the active region 102A so as to incorporate a strain-inducing silicon/germanium alloy, as discussed above. For this purpose, a spacer layer may be deposited, for instance in combination with providing a silicon oxide liner, and the spacer material may be selectively patterned into the spacer element 166, while in other areas in which the strain-inducing semiconductor alloy may not be required, the spacer layer may be preserved. Thereafter, appropriate etch techniques are applied so as to etch through the exposed portion of the material 103 and into the region 102A, thereby forming the cavities 102C.

FIG. 1b schematically illustrates the device 100 with a silicon/germanium alloy 104 formed in the semiconductor region 102A, thereby imparting a compressive strain to a channel region 151. The semiconductor material 104 may be formed by a selective epitaxial growth process, wherein a germanium concentration of up to 35 atomic percent or more in accordance with available deposition techniques is achieved, thereby obtaining a desired high compressive strain component. Consequently, the material 104 is selected so as to provide the desired strain component, while the threshold adjusting material 103, which represents a part of the channel region 151, results in a desired band gap offset in order to obtain the desired threshold voltage in combination with the work function of the material layer 164 in combination with the characteristics of the gate dielectric materials 161, 162.

FIG. 1c schematically illustrates the semiconductor device 100 when performing an implantation process 105 in order to incorporate drain and source dopant species into the semiconductor region 102A in order to form the basic configuration of drain and source extension regions 152. Typically, a boron implantation species is introduced during the implantation process 105, wherein the implantation dose is selected such that a desired high concentration is obtained for the drain and source extension regions 152 in order to reduce the overall resistivity, yet avoiding undue hot carrier injection and the like. Moreover, the implantation energy is controlled so as to obtain a desired reduced penetration depth as required for the overall transistor operation. Consequently, the drain and source extension regions 152 are formed within the material 104 and within a portion of the material 103, which, however, may result in a significantly different diffusion behavior compared to a silicon material, which is still below the threshold adjusting semiconductor material 103. Consequently, upon using similar implantation dose values as are typically applied for sophisticated transistor elements based on a polysilicon/silicon oxynitride gate electrode structure, i.e., without the semiconductor material 103, the reduced diffusivity of the dopants in the drain and source extension regions 152 as implanted may result in a reduced dopant diffusion and thus in a reduced overlap with the gate electrode structure 160. Due to the reduced Miller capacitance, the corresponding threshold voltage and other transistor characteristics may, therefore. result in reduced overall performance of the transistor 150. Consequently, in some approaches, the implantation dose during the process 105 may be increased, for instance up to two or three times the dose of conventional sophisticated polysilicon/silicon oxynitride devices, in order to compensate for the reduced diffusion activity. After the implantation process 105 and after any halo implantation processes, i.e., an implantation process for introducing a dopant species into the semiconductor region 102A below the channel region 151 so as to locally increase the corresponding dopant concentration, the processing is continued by forming an additional sidewall spacer structure that provides an increased lateral offset for performing further implantation processes in order to implant the drain and source regions into the active region 102A.

FIG. 1d schematically illustrates the device 100 with a sidewall spacer structure 154 and drain and source regions 153 formed on the basis of the structure 154, as indicated above. Moreover, the device 100 is subjected to one or more anneal processes 106 in order to provide the desired degree of dopant diffusion and also activate the dopants. For instance, appropriate spike anneal techniques, possibly in combination with extremely fast laser-based or flashlight-based anneal processes, are applied. Consequently, the final dopant profile is obtained during the anneal process or processes 106 wherein, however, as discussed above due the presence of the material 103 that reduces the diffusivity of the P-type dopant species, a reduced overlap of the extension regions 152 may be obtained, as indicated by the solid line 152R, if a standard implantation dose has been used during the implantation process 105 of FIG. 1c. On the other hand, a desired increased overlap may be obtained in the material 103 upon providing an increased dopant concentration for the extension regions 152, as indicated by the dashed line 152T, wherein, however, dopant species may also diffuse into the silicon area of the channel region 151, in which the dopant species has a significantly greater diffusivity, thereby resulting in an increased dopant concentration in or below the channel region 151. The increased P-type dopant concentration in this area, however, may result in additional transistor leakage currents and may also increase the probability of punch through events. Consequently, the dopant concentration for the extension regions 152 and thus also of the drain and source regions 153 may not be arbitrarily increased.

Consequently, a non-optimized dopant profile after forming the drain and source extension regions 152 and the drain and source regions 153 on the basis of an increased dopant concentration may make the approach of adjusting the threshold voltage of the transistor 150 on the basis of the material 103 less than desirable due to increased leakage currents and the risk of punch through.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices including P-channel transistors and corresponding manufacturing techniques for forming the same, wherein the work function of a high-k metal gate electrode structure may be adjusted on the basis of a threshold adjusting semiconductor material, while nevertheless enabling a moderately high dopant concentration in the drain and source extension regions and also in the drain and source regions. To this end, the diffusion behavior of the P-type dopant species in the silicon material outside the threshold adjusting semiconductor material, and in some illustrative embodiments outside of a strain-inducing semiconductor alloy, is modified by providing a diffusion blocking or diffusion hindering species, thereby suppressing undue incorporation of the P-type dopant species in the silicon areas of the active region and in particular of the channel region of the P-type transistor. In some illustrative embodiments, the presence of a diffusion blocking species may be restricted to the silicon areas, while other areas, such as silicon/germanium areas and the like, may not receive the diffusion blocking species. In this manner, the desired high dopant concentration may be substantially kept within the threshold adjusting semiconductor material and with the strain-inducing semiconductor material, if provided, which may result in a desired very efficient dopant profile. In some illustrative aspects disclosed herein, the diffusion blocking species, for instance in the form of fluorine and the like, may be incorporated into the active region without requiring additional lithography steps.

One illustrative method disclosed herein comprises introducing a diffusion blocking species into a semiconductor region of a P-channel transistor. The method further comprises forming a threshold adjusting semiconductor material on the semiconductor region, which comprises the diffusion blocking species. Additionally, the method comprises forming a gate electrode structure on the threshold adjusting semiconductor material, wherein the gate electrode structure comprises a gate dielectric material separating an electrode material of the gate electrode structure from a channel region in the threshold adjusting semiconductor material. Moreover, the method comprises introducing dopants for drain and source extension regions and drain and source regions and annealing the P-channel transistor by using the diffusion blocking species to suppress dopant diffusion below the channel region.

A further illustrative method disclosed herein relates to forming a P-channel transistor. The method comprises performing a first implantation process so as to incorporate a well dopant species into an active region of the P-channel transistor by using an implantation mask. The method additionally comprises performing a second implantation process to incorporate a non-doping species into the active region. Moreover, an anneal process is performed to activate the well dopant species and stabilize the non-doping species. Furthermore, the method comprises forming a semiconductor material on the active region and forming a gate electrode structure on the semiconductor material. Additionally, the method comprises forming drain and source extension regions and drain and source regions in the active region adjacent to the gate electrode structure.

One illustrative P-channel transistor disclosed herein comprises an active region formed above a substrate, wherein the active region comprises a doped silicon base material and a threshold adjusting semiconductor material. The silicon base material comprises a well dopant species and a diffusion blocking species. The P-channel transistor further comprises a gate electrode structure formed on the threshold adjusting semiconductor material and drain and source extension regions formed in the threshold adjusting semiconductor material. Additionally, the P-channel transistor comprises drain and source regions formed in the active region and connecting to the drain and source extension regions.

BRIEF DESCRIPTION OF THE DRAWINGS

The disclosure may be understood by reference to the following description taken in conjunction with the accompanying drawings, in which like reference numerals identify like elements, and in which.

Figure 1A:
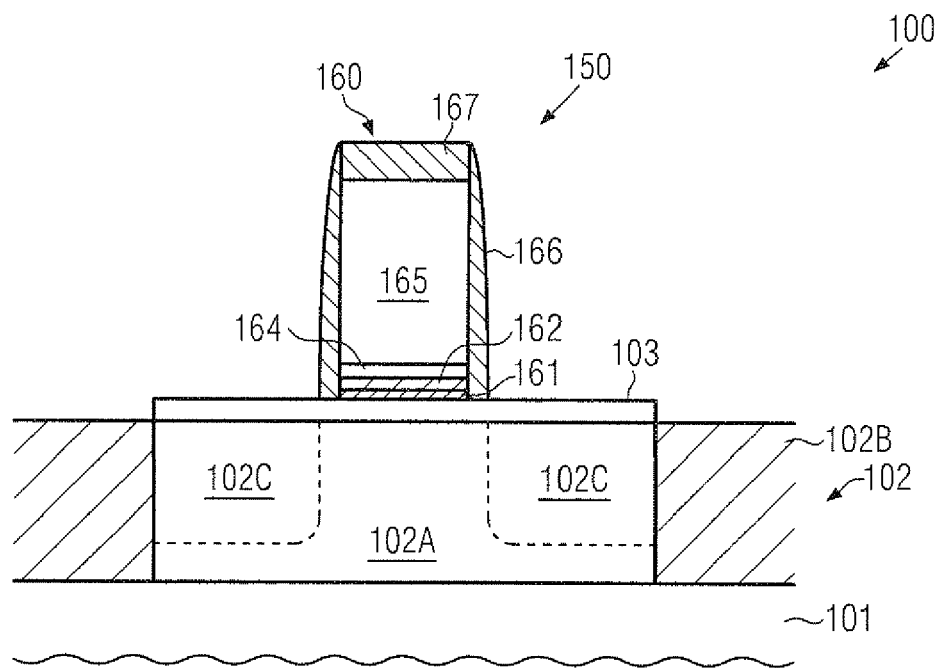
FIGS. 1a-1d schematically illustrate cross-sectional views of a semiconductor device during various manufacturing stages in forming a P-channel transistor on the basis of a high-k metal gate electrode structure and a threshold adjusting semiconductor material according to conventional strategies.
Figure 1B:
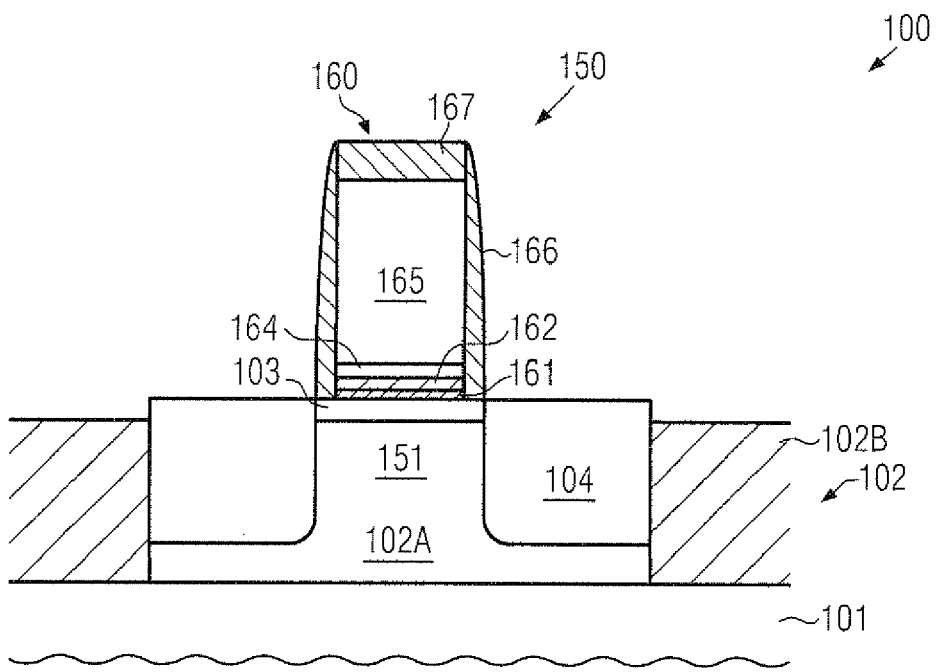
Figure 1C:
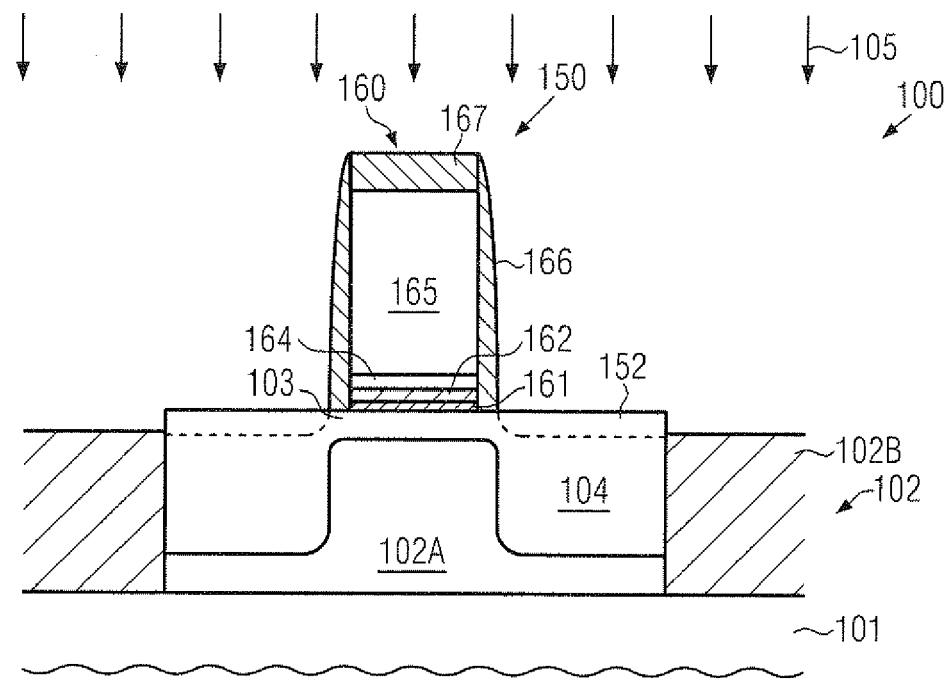
Figure 1D:
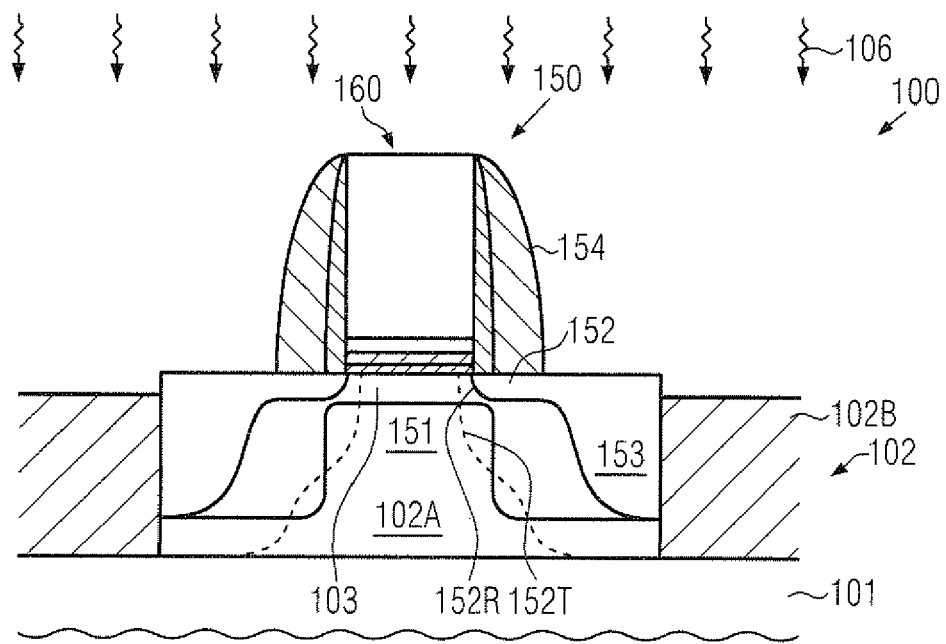

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure provides semiconductor devices and manufacturing techniques in which P-channel transistors may be formed on the basis of an additional semiconductor material formed on the active regions prior to patterning the gate electrode structures, in order to appropriately adjust the threshold voltage of the P-channel transistor. The different diffusion behavior of this additional semiconductor material, which may also be referred to as threshold adjusting semiconductor material, may efficiently be taken into account by appropriately positioning a diffusion blocking species or a non-doping species, which may hinder or significantly reduce the migration or diffusion of P-type dopant species from the threshold adjusting semiconductor material into the silicon material. In this manner, a desired high dopant concentration may be provided in the threshold adjusting semiconductor material, while nevertheless providing a desired overall dopant profile that avoids undue leakage currents and a high probability of punch through events. In some illustrative embodiments, a strain-inducing semiconductor material may be incorporated into the active region, wherein the non-doping species or diffusion blocking species may also reduce a diffusion of dopant species into the adjacent silicon material, thereby also efficiently confining the P-type dopant species, thereby also enabling high dopant concentrations in the drain and source regions, which may, for instance, be advantageous in view of overall conductivity of the drain and source regions and which may also reduce the resulting resistance between the nickel silicide material and the drain and source regions, since a high dopant concentration may significantly reduce the Schottky barrier at the interface between the semiconductor material and the nickel silicide. Thus, in some illustrative embodiments, complex high-k metal gate electrode structures may be provided and the work function thereof may be adjusted in an early manufacturing stage on the basis of the threshold adjusting semiconductor material, while nevertheless achieving a desired dopant profile.

With reference to FIGS. 2a-2j, further illustrative embodiments will now be described in more detail, wherein reference may also be made to FIGS. 1a-1d, if appropriate.

Figure 2A:
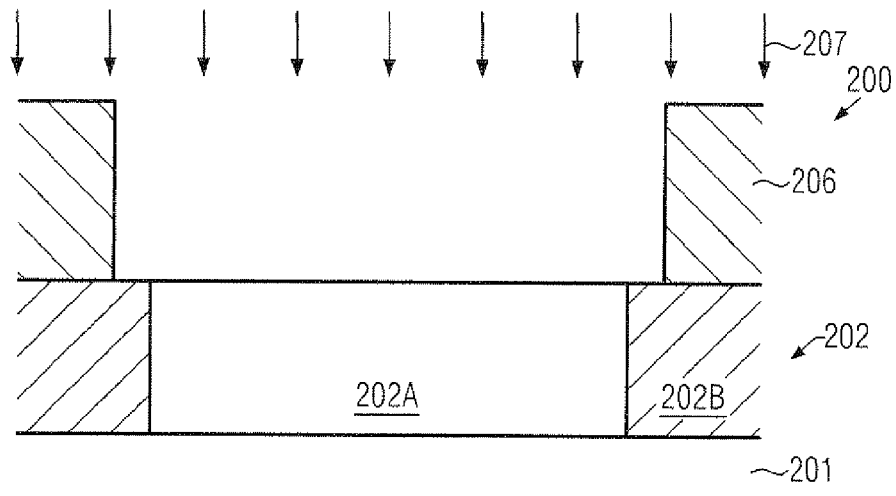
FIGS. 2a-2j schematically illustrate cross-sectional views of a semiconductor device during various manufacturing stages in forming a P-channel transistor including sophisticated gate electrode structures and a threshold adjusting semiconductor material according to illustrative embodiments.

FIG. 2a schematically illustrates a cross-sectional view of a semiconductor device 200 comprising a substrate 201 and a semiconductor layer 202, which may be substantially comprised of silicon material, at least in an initial manufacturing stage. It should be appreciated, however, that the semiconductor layer 202 may comprise additional substances, such as dopant species, unintentionally introduced impurities and the like. Furthermore, the substrate 201 and the semiconductor layer 202 may represent a silicon-on-insulator (SOI) configuration when a buried insulating material (not shown) is formed between the substrate 201 and the semiconductor layer 202. In other cases, the semiconductor layer 202 may connect to a crystalline material of the substrate 201, such as a silicon material. Moreover, in the manufacturing stage shown, the semiconductor layer 202 may comprise isolation structures 202B, for instance in the form of shallow trench isolations and the like, which laterally delineate semiconductor regions, such as a semiconductor region 202A. In the embodiment shown, the semiconductor region 202A may represent the active region of a P-channel transistor still to be formed. It should further be appreciated that any criteria of components described with reference to the semiconductor device 100 may also apply for the components of the device 200 described so far. Furthermore, in the manufacturing stage shown, an implantation mask 206, such as a resist mask, is provided so as to expose the active region 202A. As previously explained, the implantation mask 206 may cover other active regions, such as active regions of N-channel transistors.

The semiconductor device 200 as illustrated in FIG. 2a may be formed on the basis of any appropriate process strategy, for instance as is also described previously with respect to the device 100. After forming the implantation mask 206, a first implantation process 207 may be performed to introduce a desired well dopant species, i.e., an N-type dopant species. For this purpose, any well-established implantation techniques may be applied during the process 207.

Figure 2B:
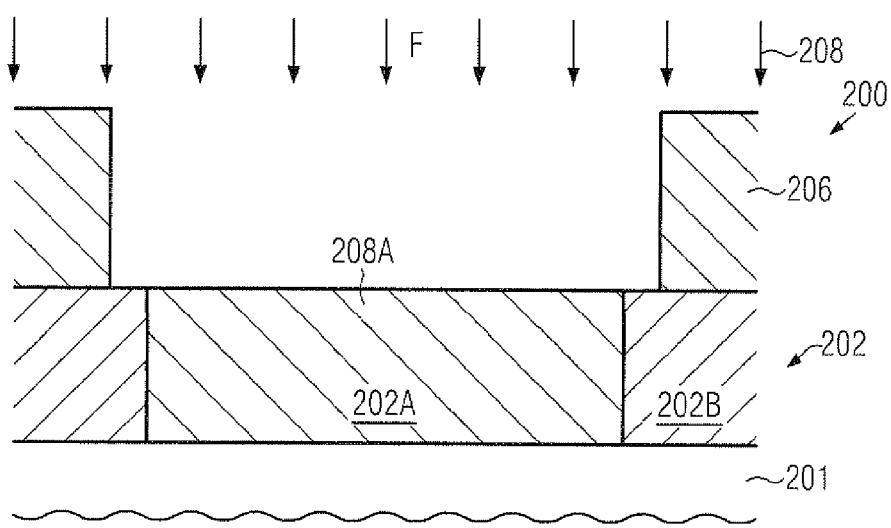

FIG. 2b schematically illustrates the semiconductor device 200 when subjected to a further implantation process 208, in which a diffusion blocking species 208A may be introduced into the active region 202A. In this context, a diffusion blocking species is to be understood as a substance that, when incorporated in the active region 202A, may significantly reduce the diffusion of a P-type dopant species that is still to be incorporated into the active region 202A. For example, a maximum concentration of approximately $10^{16}$-$10^{17}$ of the species 208A in the active region 202A may result in a reduction of the average diffusion length for a given thermal treatment, as may be applied during the annealing of drain and source regions, of approximately 50 percent and higher compared to the average diffusion length of the P-type dopant species in the active region 202A without providing the species 208A. For example, fluorine represents an efficient diffusion blocking species since it is assumed that boron diffusion in crystalline silicon material takes place by using interstitial lattice sites. Consequently, by incorporating fluorine species, a large number of the interstitial lattice sites may be occupied, which is then no longer available for boron diffusion. Consequently, appropriate concentrations for a corresponding diffusion blocking species may be determined by experiment in order to obtain a desired degree of diffusion blocking effect. For example, by applying the above-specified concentration ranges, a diffusion of boron in the silicon material of the active region 202A may be negligible compared to the diffusion of boron in a threshold adjusting semiconductor material still to be formed.

It should be appreciated that, in other illustrative embodiments, other diffusion blocking or non-doping species, such as nitrogen, carbon and the like, may be introduced into the active region 202A, wherein, as discussed above, any appropriate concentration of these species may be determined on the basis of experiments.

It should be appreciated that appropriate process parameters for the implantation process 208 may be readily established on the basis of simulation, experiment and the like, in order to obtain a homogenous distribution of the species 208A in the semiconductor region 202A. In the embodiment illustrated in FIG. 2b, the implantation process 208 may be performed by using the same implantation mask 206. Consequently, any additional lithography steps may be avoided. It should be appreciated that the implantation processes 207 and 208 may be performed in a reverse order, depending on the overall process strategy. Furthermore, additional implantation processes may be performed to introduce any additional dopant species as required for obtaining the desired transistor characteristics.

Figure 2C:
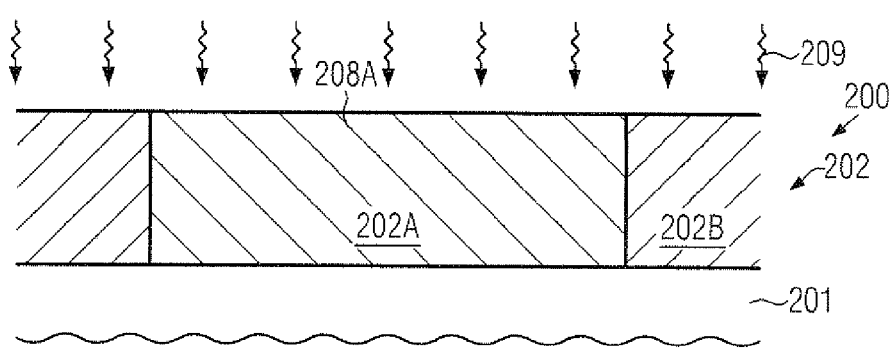

FIG. 2c schematically illustrates the semiconductor device 200 in a further advanced manufacturing stage in which the implantation mask 206 of FIG. 2b has been removed and the device 200 is exposed to an anneal process 209. During the process 209, the previously introduced dopant species are activated, i.e., positioned at lattice sites, and also the diffusion blocking species 208A is thermally stabilized, thereby significantly suppressing a diffusion of the species 208A during the further processing of the device 200. For this purpose, any appropriate anneal techniques, such as rapid thermal annealing (RTA), laser-based anneal techniques and the like, may be applied in which an effective temperature of approximately 700-1100° C. may be used.

Figure 2D:
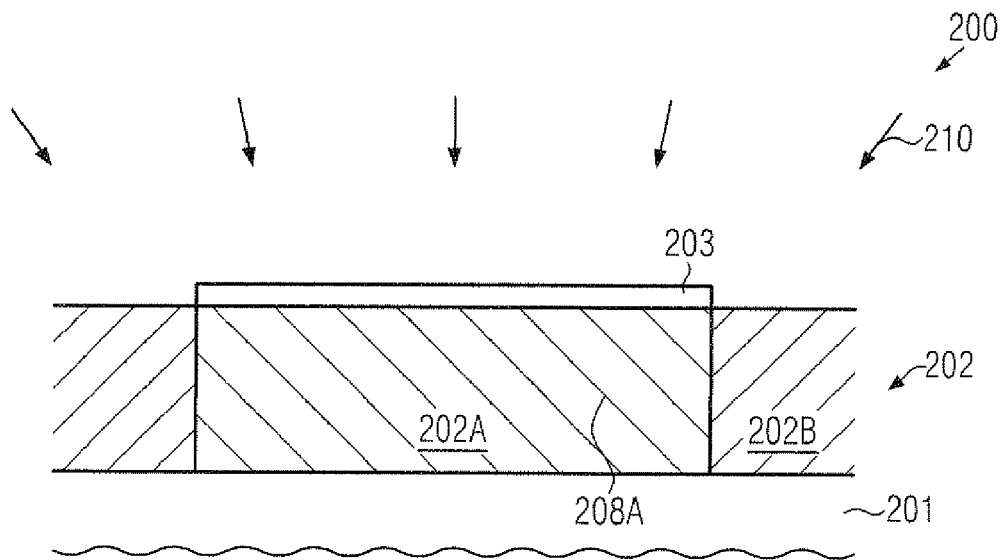

FIG. 2d schematically illustrates the semiconductor device 200 in a further advanced manufacturing stage in which a semiconductor material 203 is selectively formed on the active region 202A on the basis of a selective epitaxial growth process 210. As previously discussed, during the process 210, deposition of semiconductor material is substantially restricted to exposed crystalline surface areas, such as the active region 202A, while a material deposition on the isolation structures 202B is efficiently suppressed. The semiconductor material 203, for instance in the form of a silicon/germanium semiconductor material, may be provided with an appropriate thickness and material composition in order to appropriately adjust the threshold voltage of a transistor still to be formed, as is also previously explained. It should be appreciated that, due to the preceding thermal stabilization of the species 208A, any diffusion thereof into the material 203 during the deposition process 210 may be avoided.

Figure 2E:
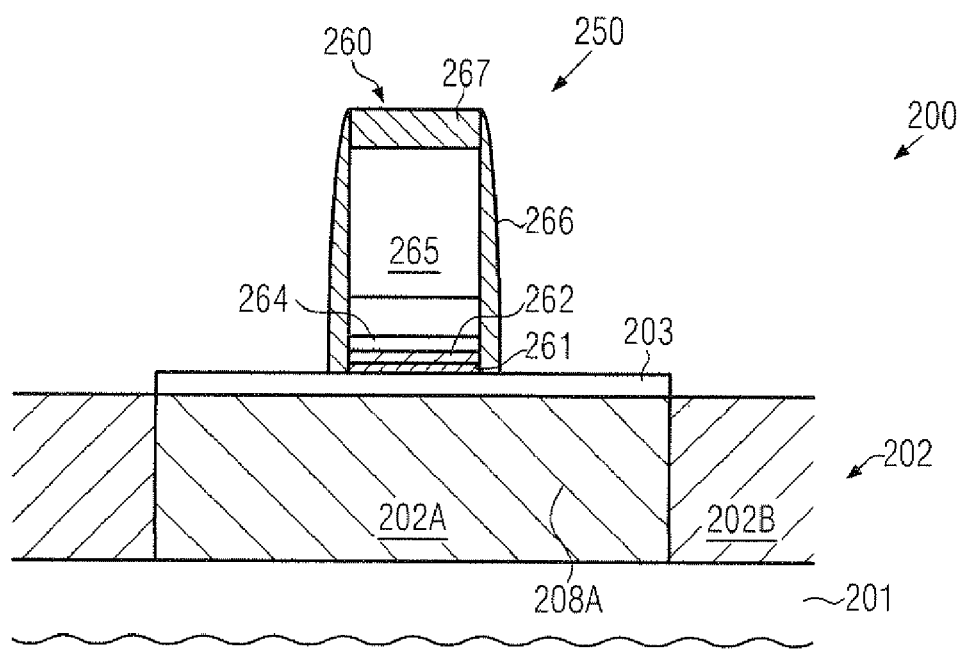

FIG. 2e schematically illustrates the semiconductor device 200 in a further advanced manufacturing stage. As illustrated, a gate electrode structure 260 may be formed on the semiconductor material 203, which now also represents a portion of the active region 202A. The gate electrode structure 260 comprises a gate dielectric material, which may comprise two or more sub-layers 261, 262. Moreover, an electrode material 265, possibly in combination with an additional material 264, may be provided. These materials may be confined by a dielectric cap material 267 and a spacer structure 266. In some illustrative embodiments, the gate electrode structure 260 may represent a high-k metal gate electrode structure, wherein at least one of the dielectric layers 261, 262 comprises a material having a dielectric constant of 10.0 and higher, while the electrode material 264 may include an appropriate work function adjusting species, such as aluminum and the like, as is also previously discussed with reference to the semiconductor device 100. Moreover, with respect to any manufacturing techniques, it may also be referred to the gate electrode structure 160 of the semiconductor device 100 previously described with reference to FIGS. 1a-1d.

Figure 2F:
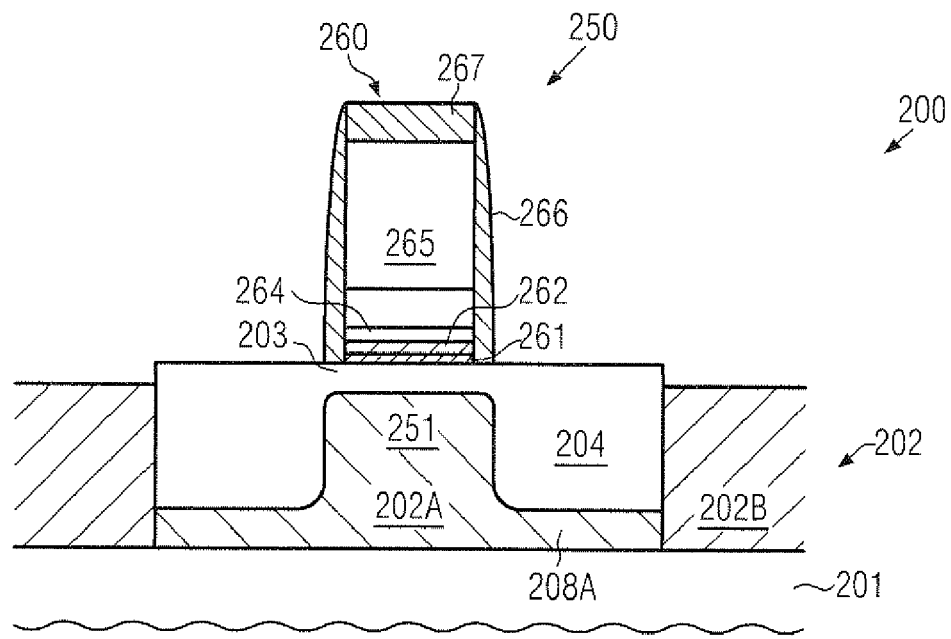

FIG. 2f schematically illustrates the semiconductor device 200 in a further advanced manufacturing stage. As illustrated, the active region 202A may, in addition to the threshold adjusting semiconductor material 203, comprise a strain-inducing semiconductor material 204, for instance in the form of silicon/germanium and the like, in order to provide a desired compressive strain component in a channel region 251 of a P-channel transistor 250. The strain-inducing semiconductor material 204 may be formed in accordance with process techniques as are previously described with reference to the semiconductor device 100. Consequently, a portion of the active region 202A and thus of the channel region 251 may comprise the initial silicon-based material including the well dopant species and in particular including the diffusion blocking species 208A. On the other hand, the diffusion blocking species 208A may be substantially excluded from the materials 203 and 204. That is, during the preceding process sequence for forming cavities in the active region 202A and refilling the cavities by a selective epitaxial growth process, the thermally stabilized species 208A may substantially not diffuse into the materials 203 and 204. Consequently, these materials may be provided as substantially undoped materials, while also the incorporation of the diffusion blocking species 208A may be efficiently suppressed.

Figure 2G:
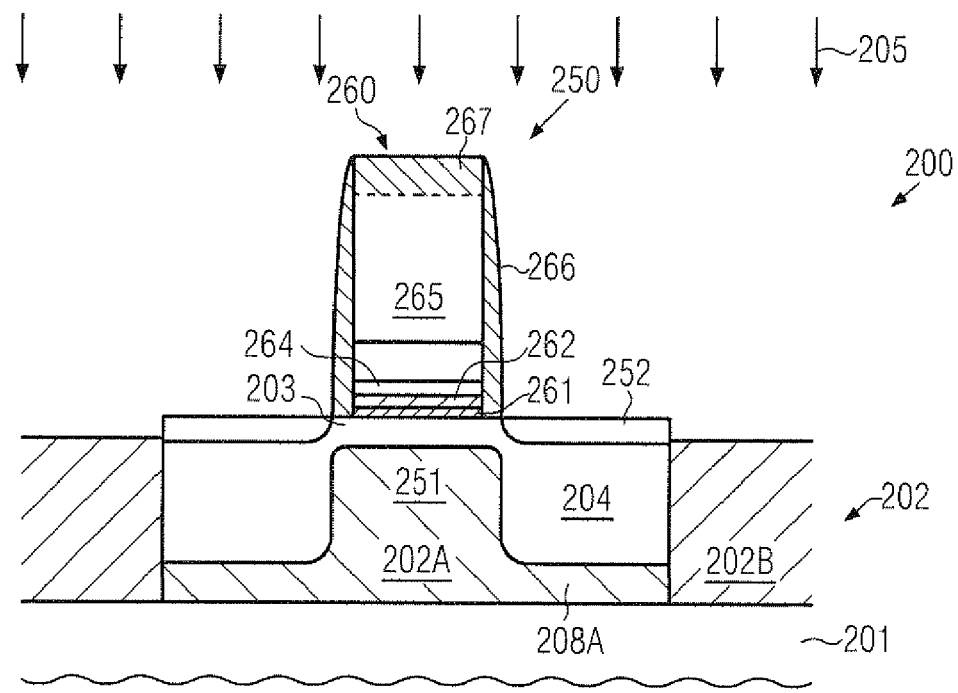

FIG. 2g schematically illustrates the semiconductor device 200 in a further advanced manufacturing stage. As illustrated, an implantation process 205 may be performed in order to introduce drain and source dopant species, thereby forming the basic configuration of drain and source extension regions 252 within the material 204 and possibly within a portion of the material 203, depending on the process parameters of the implantation process 205. As previously explained, during the implantation process 205, an appropriate implantation dose may be used in order to provide a desired diffusion activity during the further processing, which may be required for laterally driving the dopant species of the extension regions 252 under the gate electrode structure 260 in order to achieve the desired Miller capacitance. Consequently, appropriate implantation dose values may be selected in view of obtaining a desired Miller capacitance without being restricted by undue dopant diffusion into a portion of the channel region 251 formed below the material 203 due to the presence of the diffusion blocking species 208A.

Figure 2H:
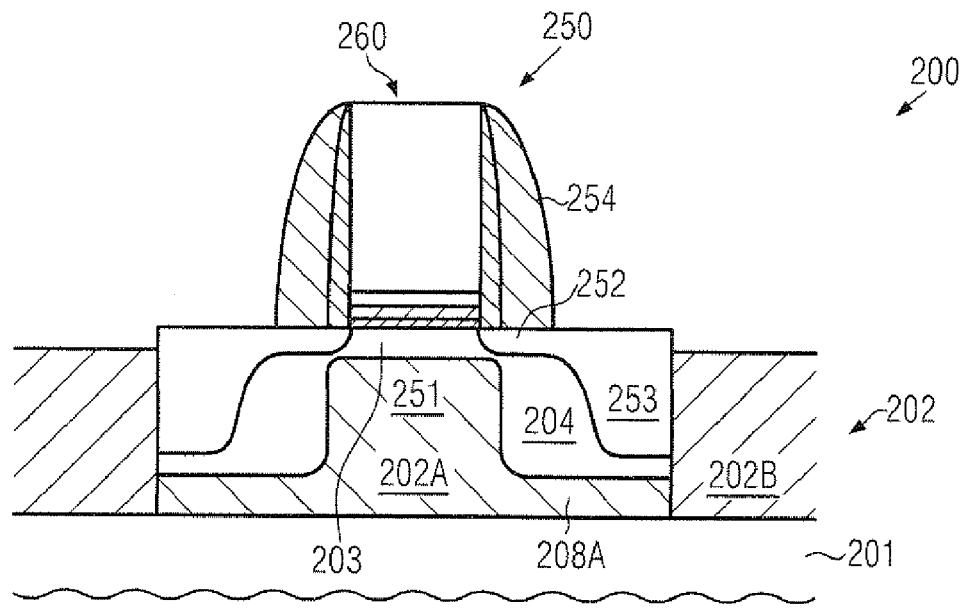

FIG. 2h schematically illustrates the device 200 in a further advanced manufacturing stage in which a spacer structure 254 is formed on sidewalls of the gate electrode structure 260 so as to determine a lateral offset of drain and source regions 253 formed in the active region 202A, i.e., in the embodiment shown, within the strain-inducing semiconductor material 204. For this purpose, any appropriate implantation techniques and manufacturing sequences for forming the sidewall spacer structure 254 may be applied. It should be appreciated that a desired high dopant concentration may be provided in the drain and source regions 253, thereby reducing the series resistance and providing superior conditions for forming a metal silicide in a later manufacturing stage.

Figure 2I:
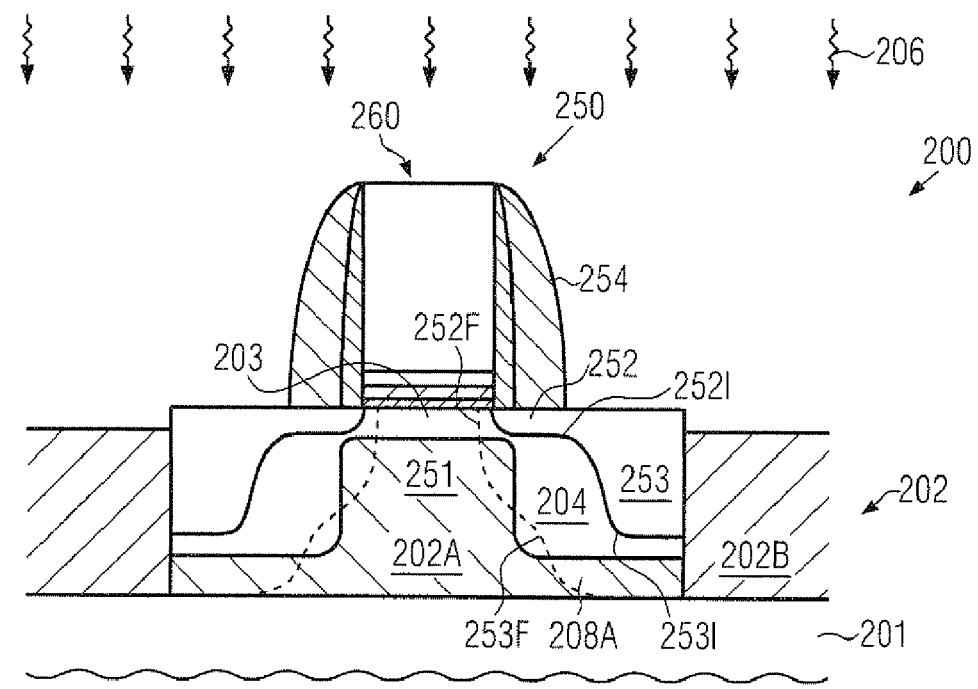

FIG. 2i schematically illustrates the semiconductor device 200 when subjected to an anneal process or process sequence 206 performed to activate the dopant species, re-crystallize implantation-induced damage and adjusting the final dopant profile. As previously explained with reference to the device 100, any appropriate anneal process technique or a combination of various process techniques may be applied so as to obtain a high degree of dopant activation and induce a desired degree of diffusion activity. Thus, during the anneal process or processes 206, the initial extension region 252, as indicated by the solid line 2521, may laterally "move" in the material 203 due to the initially high dopant concentration, thereby achieving the desired overlap and thus Miller capacitance, as indicated by the final state 252F. The lateral diffusion may not be substantially hindered by any diffusion blocking species since the species 208A has efficiently been confined within the silicon portion of the active region 202A due to the thermal stabilization thereof. Consequently, an efficient interface may be formed between the material 203 and the active region 202A having the initial silicon material, thereby suppressing or at least significantly reducing a dopant diffusion below the material 203, as may typically occur in conventional approaches when initially providing a high dopant concentration in the drain and source extension regions, as discussed with reference to the device 100.

Similarly, the drain and source regions 253 having the initial state 2531 may diffuse within the material 204 without being hindered by the species 208A. If desired, the drain and source regions 253 may substantially completely fill the material 204, while a further diffusion may be efficiently restricted by the species 208A still present in the silicon areas of the active region 202A. Thus, if required, the final PN junction 253F may be within the material 204 or may extend to the periphery thereof, depending on the process conditions of the process or processes 206. Consequently, a well-defined dopant profile with a desired Miller capacitance may be accomplished, while nevertheless providing a high dopant concentration in the extension regions 252 and the drain and source regions 253.

Figure 2J:
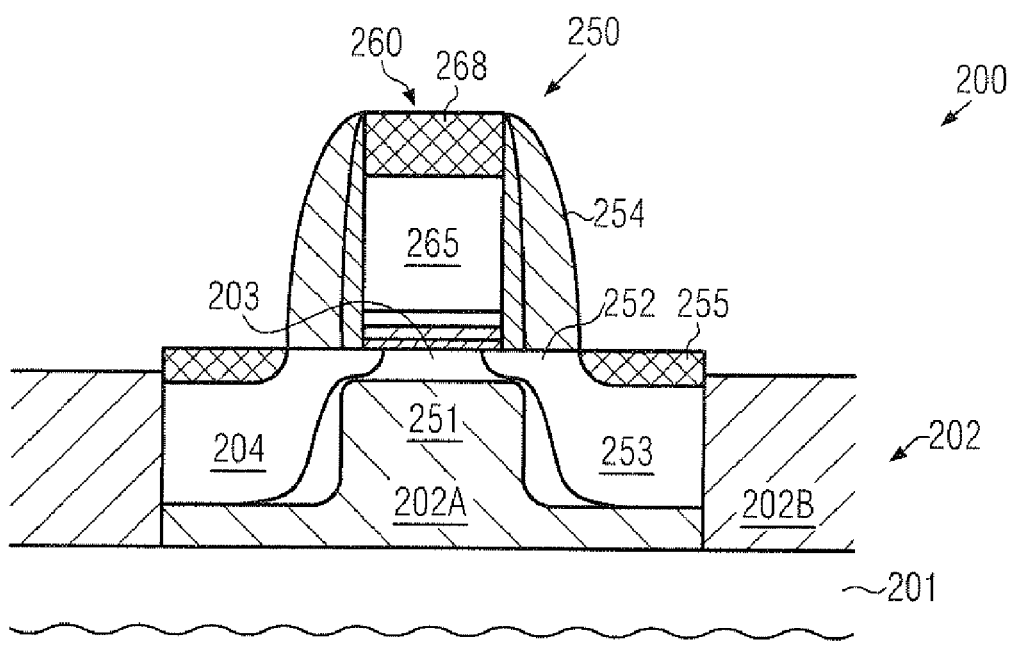

FIG. 2j schematically illustrates the semiconductor device 200 in a further advanced manufacturing stage. As shown, metal silicide regions 255 may be formed in the drain and source regions 253 in order to further reduce the overall resistance of the transistor 250. In the embodiment shown, a metal silicide region 268 may also be formed in the gate electrode structure 260, if required. In other cases, a portion of the gate electrode material, for instance the electrode material 265, may be replaced by a conductive metal in a later manufacturing stage. The metal silicide regions 255 and 268 may be formed on the basis of any appropriate process technique, for instance using any appropriate refractory metal, such as nickel, platinum and the like. It should be appreciated that nickel silicide, which may be highly conductive, may form a Schottky barrier with a semiconductor material, which may thus represent a highly resistive structure. Upon heavy doping, the corresponding barrier may be significantly lowered, thereby contributing to a superior overall resistance of the transistor 250. Since a high dopant concentration may be applied in the drain and source regions 253, a corresponding Schottky barrier may be advantageously lowered, thereby providing superior contact resistivity.

As a result, the present disclosure provides semiconductor devices and manufacturing techniques in which P-channel transistors may be formed on the basis of a threshold adjusting semiconductor material in which a desired lateral diffusion may be achieved on the basis of an increased drain and source extension dopant concentration, while undue diffusion out of the threshold adjusting material, for instance into lower lying silicon-based areas, may be suppressed by providing a diffusion blocking species, such as fluorine and the like, in an early manufacturing stage. The diffusion blocking species may be thermally stabilized, thereby eventually avoiding an incorporation of this species in the threshold adjusting semiconductor material and also in a strain-inducing semiconductor alloy, if provided. Consequently, a high drain and source extension dopant concentration in combination with a high source and drain dopant concentration may be applied in order to obtain the reduced overall series resistance of the P-channel transistor in combination with a desired high Miller capacitance. Consequently, the threshold voltage may be adjusted in an early manufacturing stage, i.e., upon patterning the gate electrode structure on the basis of a work function adjusting species and the threshold adjusting semiconductor material, while at the same time ensuring superior transistor behavior, for instance in view of leakage currents, punch through and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    introducing a well dopant species into said semiconductor region on the basis of an implantation mask;
    introducing a diffusion blocking species into a semiconductor region of a P-channel transistor, wherein said diffusion blocking species is introduced by using said implantation mask;
    forming a threshold adjusting semiconductor material on said semiconductor region, said semiconductor region comprising said diffusion blocking species;
    forming a gate electrode structure on said threshold adjusting semiconductor material, said gate electrode structure comprising a gate dielectric material separating an electrode material of said gate electrode structure from a channel region in said threshold adjusting semiconductor material;
    introducing dopants for drain and source extension regions and drain and source regions; and
    annealing said P-channel transistor by using said diffusion blocking species to suppress dopant diffusion below said channel region.

2. The method of claim 1, further comprising annealing said semiconductor region prior to forming said threshold adjusting semiconductor material so as to stabilize said diffusion blocking species.

3. The method of claim 1, wherein said diffusion blocking species comprises fluorine.

4. The method of claim 1, wherein said diffusion blocking species comprises at least one of nitrogen and carbon.

5. The method of claim 1, further comprising forming a strain-inducing semiconductor alloy in said semiconductor region after forming said gate electrode structure.

6. The method of claim 5, wherein introducing said dopant for the drain and source regions is performed so as to position said dopants within said strain-inducing semiconductor alloy.

7. The method of claim 1, wherein forming said gate electrode structure comprises forming said gate dielectric material so as to include a high-k dielectric material and forming a metal-containing material on said gate dielectric material.

8. The method of claim 1, wherein said threshold adjusting semiconductor material is comprised of silicon and germanium.

9. The method of claim 5, wherein said strain-inducing semiconductor alloy is comprised of silicon and germanium.

10. A method of forming a P-channel transistor, the method comprising:
performing a first implantation process so as to incorporate a well dopant species into an active region of said P-channel transistor by using an implantation mask;
performing a second implantation process so as to incorporate a non-doping species into said active region;
performing an anneal process so as to activate said well dopant species and stabilize said non-doping species;
forming a semiconductor material on said active region;
forming a gate electrode structure on said semiconductor material; and
forming drain and source extension regions and drain and source regions in said active region adjacent to said gate electrode structure.

11. The method of claim 10, further comprising forming a strain-inducing semiconductor material in said active region after forming said gate electrode structure and prior to forming said drain and source regions.

12. The method of claim 10, wherein said second implantation process is performed by using said implantation mask.

13. The method of claim 10, wherein said non-doping species comprises fluorine.

14. The method of claim 10, wherein said gate electrode structure is formed so as to comprise a high-k dielectric material and a metal-containing material comprising a work function adjusting species.

15. The method of claim 10, further comprising forming a metal silicide on said drain and source regions and on said gate electrode structure.

16. A method, comprising:
introducing a diffusion blocking species into a semiconductor region of a P-channel transistor;
stabilizing said diffusion blocking species by annealing said semiconductor region;
after stabilizing said diffusion blocking species, forming a threshold adjusting semiconductor material on said semiconductor region, said semiconductor region comprising said diffusion blocking species;
forming a gate electrode structure on said threshold adjusting semiconductor material, said gate electrode structure comprising a gate dielectric material separating an electrode material of said gate electrode structure from a channel region in said threshold adjusting semiconductor material;
introducing dopants for drain and source extension regions and drain and source regions; and
annealing said P-channel transistor by using said diffusion blocking species to suppress dopant diffusion below said channel region.

* * * * *